(12) United States Patent
Kim

(10) Patent No.: US 7,274,559 B2
(45) Date of Patent: Sep. 25, 2007

(54) COVER FOR REDUCING CONTAMINATION IN A PLASMA DISPLAY DEVICE AND PLASMA DISPLAY DEVICE EMPLOYING THE COVER

(75) Inventor: Yeung-Ki Kim, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 83 days.

(21) Appl. No.: 11/318,686

(22) Filed: Dec. 28, 2005

(65) Prior Publication Data

US 2006/0152895 A1    Jul. 13, 2006

(30) Foreign Application Priority Data

Jan. 12, 2005   (KR) .................... 10-2005-0002912

(51) Int. Cl.
*G06F 1/16* (2006.01)
(52) U.S. Cl. ............... 361/681; 361/683; 313/456; 313/495; 349/58; 349/149; 345/60; 345/76; 345/175; 315/169.1
(58) Field of Classification Search ............... 361/679, 361/681, 682, 683, 752, 816, 825; 313/422, 313/461, 456, 402, 567, 495, 497, 496; 349/58, 349/60, 69, 113, 149; 345/76, 173, 60–65, 345/89, 175, 905; 248/176.1, 371, 132, 398; 312/223.2, 223.3, 7.2; 315/169.1, 169.3; 174/35 R, 35 MS
See application file for complete search history.

(56) References Cited

U.S. PATENT DOCUMENTS

| | | | |
|---|---|---|---|
| 6,480,243 B2 * | 11/2002 | Yamamoto | 348/836 |
| 6,560,124 B1 * | 5/2003 | Irie et al. | 361/816 |
| 6,688,576 B2 * | 2/2004 | Oishi et al. | 248/317 |
| 6,813,159 B2 * | 11/2004 | Irie et al. | 361/752 |
| 7,106,392 B2 * | 9/2006 | You | 349/58 |
| 7,218,521 B2 * | 5/2007 | Kim | 361/704 |
| 2005/0174301 A1 * | 8/2005 | Kim | 345/3.1 |

* cited by examiner

Primary Examiner—Michael Datskovskiy
(74) Attorney, Agent, or Firm—Lee & Morse, P.C.

(57) ABSTRACT

A cover for reducing contamination in a plasma display apparatus including a frame with a printed circuit board, signal transmission cables and buffer substrates arranged on one side thereof and including a guiding portion for guiding the cables is provided. The cover may include a first portion and a second portion that may itself include a first part and a second part. When the cover is detachably attached to the frame, the first portion may extend over the buffer substrates such that the buffer substrates are arranged between the first portion of the cover and the frame, an end portion of the first part may extend toward and/or contact a surface of the frame on which the plurality of buffer substrates and the at least one printed circuit board are arranged, and an end portion of the second part may extend toward and/or contact the guiding portion of the frame.

20 Claims, 2 Drawing Sheets

COVER FOR REDUCING CONTAMINATION IN A PLASMA DISPLAY DEVICE AND PLASMA DISPLAY DEVICE EMPLOYING THE COVER

BACKGROUND OF THE INVENTION

1. Field of the Invention

The present invention relates to a cover for reducing and/or preventing contamination in a display device. More particularly, the present invention relates to a plasma display device employing such a cover for reducing and/or preventing contamination of a signal transmission unit by impurities.

2. Description of the Related Art

Plasma display devices are flat panel display devices that display images using gas discharge phenomena. Plasma display devices can be made to have large thin screens with good displaying properties such as a wide viewing angle and a high image quality. Plasma display devices generally include a plasma display panel having glass substrates, and a frame that supports the plasma display panel.

FIG. 1 is a schematic perspective view of a known plasma display device. The plasma display panel illustrated in FIG. 1 includes a front substrate 11, a rear substrate 12, and a thermal conductive sheet 14 attached onto a rear surface of the rear substrate 12. The frame 17, which may be made of a metal such as aluminum, supports the plasma display panel. The plasma display panel may be attached onto a front surface of the frame 17 with a dual adhesive tape 13. As shown in FIG. 1, the dual adhesive tape 13 may be provided on portions of the frame 17 and rear substrate 17 around the thermal conductive sheet 14. A printed circuit board assembly 19 may be installed on a rear surface of the frame 17. The printed circuit board assembly 19 may include a plurality of printed circuit boards 21. Printed circuit boards 21 of the printed circuit board assembly 19 may be supported away from the frame 17 by studs 16. Various electronic elements 18 may be disposed on the printed circuit boards 21 of the printed circuit board assembly 19.

Signal transmission cables 15a and 15b may respectively connect electrodes on the front substrate 11 or the rear substrate 12 to connection terminals on buffer substrates 16a and 16b. The signal transmission cables 15a and 15b may be tape carrier packages (TCPs). The signal transmission cables 15a and 15b may be connected to connectors 19a and 19b disposed on the buffer substrates 16a and 16b. Signal transmission cables 15c and connectors 19c may be used to connect the buffer substrates 16a and 16b to the printed circuit boards 21 and/or different printed circuit boards 21.

Cover plates 20 may be fixed onto upper and lower portions of the panel by screws. The cover plate 20 may include a first surface 21a and a second surface 21b to protect the signal transmission cable 15a extending along side and rear surfaces of the frame 17. When the cover plate 20 is attached to the frame 17, the signal transmission cables 15a and 15b are covered by the cover plate 20. Although FIG. 1 only illustrates cover plates 20 for the signal transmission cables 15a on the upper and lower portions if the frame 17, additional cover plates may be provided on the left and right sides of the frame 17 for the signal transmission cables 15b.

In the plasma display device illustrated in FIG. 1, although the cover plate 20 protects the signal transmission cable 15a, it cannot prevent the impurities from inducing into the signal transmission cable 15a. That is, various impurities are generated during the plasma display device is fabricated, for example, metal impurities generated when the screw is tightened, impurities remaining on cut surface when the printed circuit board is cut, and impurities generated due to operator and fabricating environment may be induced between the signal transmission cable 15a and the cover plate 20 during the device is handled, that is, fabricated and transported. The impurities affects the performance of the signal transmission cable 15a, and thus, may cause defects of the product.

SUMMARY OF THE INVENTION

The invention is therefore directed to a plasma display device having an improved structure, which substantially overcomes one or more of the problems due to the limitations and disadvantages of the related art.

It is therefore a feature of embodiments of the invention to provide a plasma display device in which impurities can be reduced and/or prevented.

It is another feature of embodiments of the invention to provide a cover employable by a plasma display panel to reduce and/or prevent contamination of signal transmission cables.

At least one of the above features and advantages of the invention may be realized by providing a plasma display device including a plasma display panel including a first substrate and a second substrate, a frame, the frame may have a first side, a second side, and a guiding portion, the first substrate and the second substrate may be arranged on the first side of the frame, at least one printed circuit board may be arranged on the second side of the frame, and a plurality of signal transmission cables. At least some of the signal transmission cables may have portions connected to electrodes formed on at least one of the first substrate and the second substrate and at least some of the signal transmission cables may extend along the guiding portion of the frame to the second side of the frame. The plasma display device may also include a plurality of buffer substrates, to which other portions of the signal transmission cables are connected, the plurality of buffer substrates being arranged a surface of the second side of the frame, and at least one cover. The cover may include a first portion and a second portion, the first portion may extending over at least one of the buffer substrates such that the at least one buffer substrate may be arranged between the first portion and the second side of the frame. The second portion may extend from the first portion, a first part of the second portion may extend toward and/or contact the surface of the second side of the frame and a second part of the second portion may extend toward and/or contact a surface of the guiding portion of the frame.

The other end portions of the signal transmission cables may be connected the buffer substrates via connectors. The first portion may include at least one opening exposing at least one of the connectors connecting the other end portions of the signal transmission cables to the buffer substrates. The first part of the second portion may include at least a portion of an opening for passing a signal transmission cable extending between one of the buffer substrates and the printed circuit board. The opening may continuously extend from a portion of the first portion to a portion of the first part of the second portion. The first part of the second portion extends from a first edge of the first portion and the first part extends perpendicularly to the first portion. The second part of the second portion may extend from a second edge of the first portion and the second part extends perpendicularly to the first portion. The second portion may further include a third part including a slit formed along an edge of the third part that contacts the surface of the second side of the frame. The second portion may include a fourth part and the first part, the second part, the third part and the fourth part may extend perpendicularly to the first portion.

At least one of the above features and advantages of the invention may be separately realized by providing a cover for reducing contamination in a plasma display apparatus including a plasma display panel, a frame with at least one printed circuit board, a plurality of signal transmission cables and a plurality of buffer substrates arranged on one side thereof, the frame including a guiding portion for guiding the signal transmission cables. The cover may include a first portion and a second portion, and the second portion may include a first part and a second part. The first portion and the second portion may form a substantially "u"-shaped cavity. When the cover is detachably attached to the frame of the plasma display apparatus, the first portion may extend over the buffer substrates such that the buffer substrates are arranged between the first portion of the cover and the frame, an end portion of the first part may extend toward and/or contact a surface of the frame on which the plurality of buffer substrates and the at least one printed circuit board are arranged, and an end portion of the second part may extend toward and/or contact the guiding portion of the frame.

The first portion may include a plurality of openings. The second portion may further include a third part including a slit along an end portion of the third part that contacts the surface of the frame when the cover is detachably attached to the frame. The second portion may include a fourth part and the first part, the second part, the third part and the fourth part may extend perpendicularly to the first portion. The first part of the second portion may extend from a first edge of the first portion and the first part may extend perpendicularly to the first portion. The second part of the second portion may extend from a second edge of the first portion and the second part may extend perpendicularly to the first portion.

At least one of the above features and advantages of the invention may be separately realized by providing a plasma display apparatus including a plasma display panel that may include a first substrate and a second substrate, a frame, the frame may have a first side, a second side, and a guiding portion, and the first substrate and the second substrate may be arranged on the first side of the frame. The plasma display panel may also include at least one printed circuit board that may be arranged on the second side of the frame, a plurality of signal transmission cables. At least some of the signal transmission cables may have portions connected to electrodes formed on at least one of the first substrate and the second substrate, and at least some of the signal transmission cables may extend along the guiding portion of the frame to the second side of the frame. The plasma display apparatus may also include a plurality of buffer substrates and contamination reducing member. The plurality of buffer substrates may be connected to the other portions of the signal transmission and the plurality of buffer substrates may be arranged a surface of the second side of the frame. The contamination reducing member may reducing and/or prevent contamination of the signal transmission cables, and the contamination reducing member may at least partially overlap three sides of the buffer substrates.

The contamination reducing member may include at least one opening that exposes at least one connector connecting the other end portions of the signal transmission cables to the buffer substrates. The contamination reducing member may include at least one openings that allows at least one signal transmission cable extending between one of the buffer substrates and the at least one printed circuit board. The contamination reducing member may have a substantially u-like shape. The contamination reducing member may have a substantially box-like shape with one side that is substantially or completely open.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
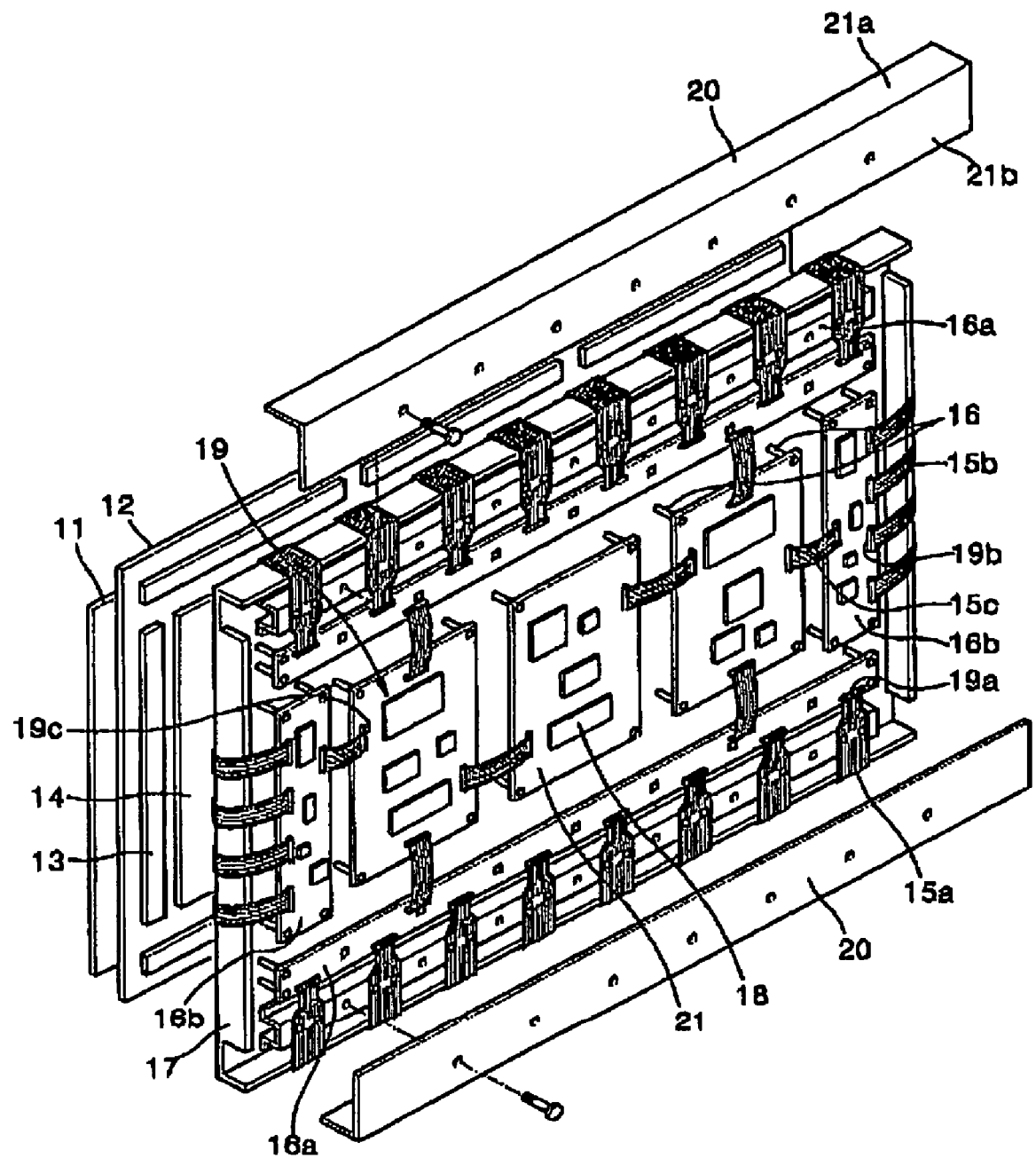
FIG. 1 illustrates a perspective view of a known plasma display device.

Korean Patent Application No. 10-2005-0002912, filed on Jan. 12, 2005, in the Korean Intellectual Property Office, and entitled: "Plasma Display Device," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Also, in the following description any reference to "left", "right", "upper" or "lower" sides is provided solely as an aid to understanding one or more aspects of the invention and is not intended to limit the features to such an orientation. Further, although in the following description reference may be made to sides, a component (e.g., frame or panel) identified with such sides may be, for example, circular or elliptical without a definite side or may have three or more sides. Principles of the invention may be employed regardless of a particular shape of the component. Like reference numerals refer to like elements throughout.

Figure 2:
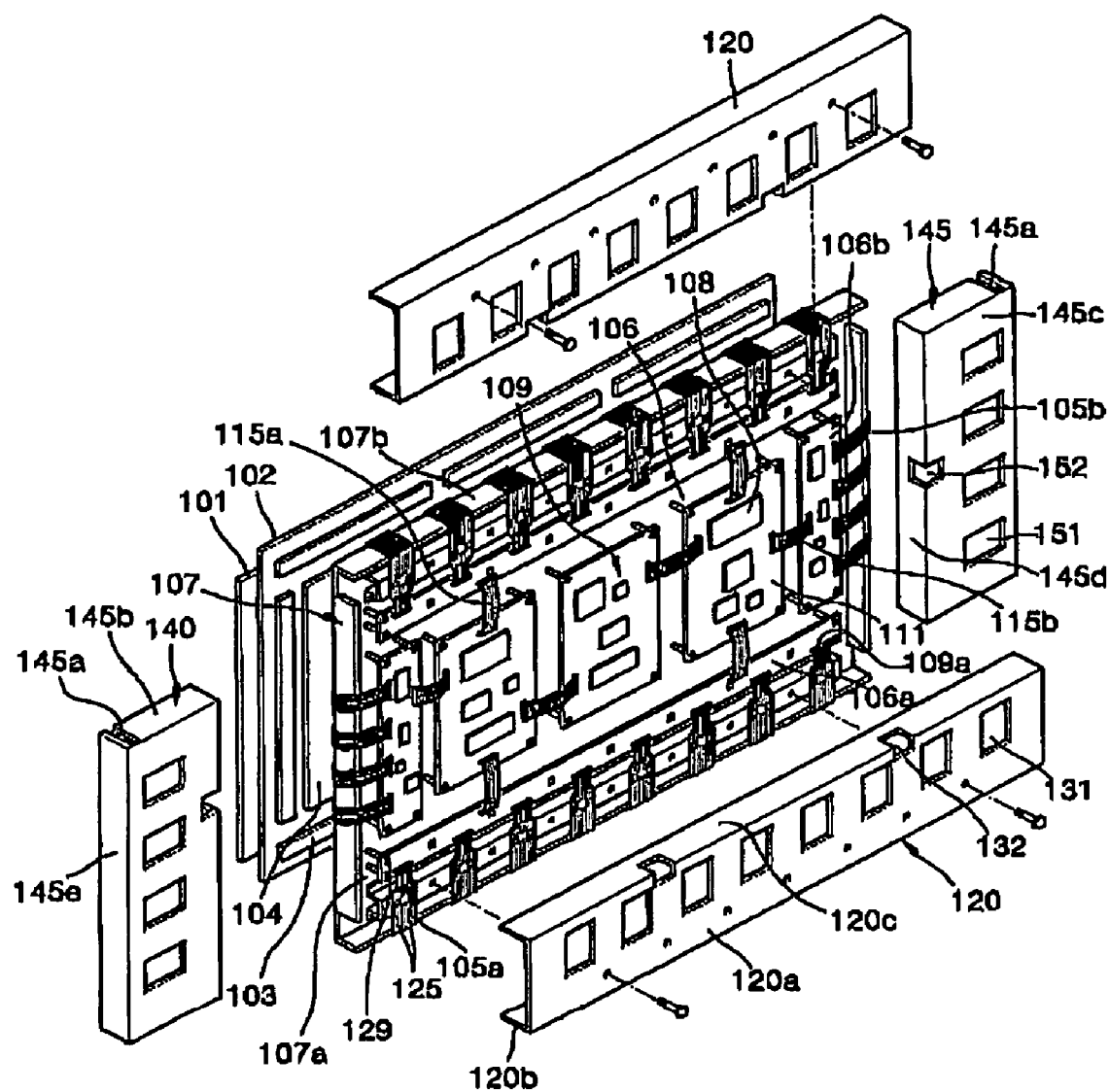
FIG. 2 illustrates a perspective view of a part of a plasma display device according to an exemplary embodiment of the invention.

FIG. 2 illustrates a perspective view of a part of a plasma display device according to an exemplary embodiment of the invention. As shown in FIG. 2, the plasma display panel may include a front substrate 101 and a rear substrate 102. A thermal conductive sheet 104 may be attached onto a rear surface of the rear substrate 102. The plasma display panel may be supported by a frame 107. The frame 107 may be made of a metal such as aluminum. The plasma display panel may be attached onto a front surface of the frame 107 with an adhesive such as a dual adhesive tape 103. In embodiments of the invention employing the dual adhesive tape 103, the dual adhesive tape 103 may be provided on portions of the frame 107 and/or rear substrate 102 that do not overlap the thermal conductive sheet 104. For example, the dual adhesive tape 103 may be arranged on portions of the frame 107 and rear substrate 102 around the thermal conductive sheet 104.

A printed circuit board assembly 109 may be arranged on a rear surface 107a of the frame 107. The printed circuit board assembly 109 may include a plurality of printed circuit boards 111. Printed circuit boards 111 of the printed circuit board assembly 109 may be supported above the rear surface 107a of the frame 107 by studs 106. Various electronic elements 108 may be disposed on the printed circuit board assembly 109. Buffer substrates 106a, 106b may be disposed around the printed circuit board assembly 109 on the rear surface 107a of the frame 107.

Signal transmission cables 105a and 105b may have connection terminals at one end portions thereof. The connection terminals may be connected, for example, to electrodes (not shown) formed on the front substrate 101 and rear substrate 102 or connectors 109a, 109b on the buffer substrates 106a, 106b. The signal transmission cables 105a and 105b may extend from the front substrate 101 and/or the rear substrate 102 toward the rear surface 107a of the frame 107. The frame 107 may include wall/guiding portions 107b, 107c. The transmission cables 105a, 105b may be guided along the respective wall/guiding portions 107b, 107c. Integrated circuit (IC) chips 125 may be mounted on the signal transmission cables 105a and 105b. Signal transmission cables 115a, 115b may be used to connect the buffer substrates 106a and 106b to the printed circuit boards 111.

In embodiments of the invention, one or more covers 120, 140 may be provided to help block impurities from entering a space between the cover 120 and respective portions of the frame 107. For example, the cover(s) 120, 140 may be provided to help shield and/or protect the signal transmission cables 105a, 105b from impurities.

As shown in FIG. 2, the covers 120, 140 may be attached to the frame 107. In embodiments of the invention, the cover 120 may be provided at upper and lower portions of the frame 107, and the cover 140 may be provided at left and right portions of the frame 107. The cover plates 120, 140 may be fixed the frame 107 with screws 129.

Each of the upper and lower cover 120 may include an overlapping portion 120a and side portions 120b, 120c. The overlapping portion 120a may be substantially flat. The overlapping portion 120a may extend parallel to the frame 107, and the side portions 120b and 120c may extend from edges of the overlapping portion 120a. For example, the side portions 120b 120c may extend perpendicularly from upper and lower edges of the overlapping portion 120a. When the upper and lower cover 120 are arranged on the frame 107, the upper and lower cover 120 may cover the signal transmission cables 105a and the buffer substrates 106a.

In embodiments of the invention, one of the side portions 120b, 120c of the cover 120 may extend from an edge of the overlapping portion 120a and may overlap and/or contact a wall/guiding portion 107b of the frame 107. The side portion 120b may extend from the overlapping portion 120a to and/or beyond a front surface of the frame 107. The side portion 120b of the cover 120 may contact the front surface of the frame 107 to help block impurities from entering the space between the cover 120 and the frame 107 and/or damage to components arranged between the frame 107 and the cover 120. The cover plate 120 may have a U-like shape such that a U-like cavity is defined for receiving, for example, the signal transmission cables 105a therein.

As shown in the exemplary embodiment illustrated in FIG. 2, the side portion 120b of the cover 120 may extend from the overlapping portion 120a and may overlap and/or contact a wall/guiding portion 107b of the frame 107 and the side portion 120c of the cover 120 may extend from the overlapping portion 120a to the rear surface 107a of the frame 107. An edge of the side portion 120c may contact the rear surface 107a of the frame 107 to help block impurities from entering the space between the cover 120 and the frame 107 and/or damage to components arranged between the frame 107 and the cover 120.

The cover 120 may include a plurality of openings that allow components arranged between the cover 120 and the frame 107 to be accessed without removing the cover 120. For example, the cover 120 may of first openings 131 enabling access, for example, to the connectors 109a, to which the signal transmission cables 105a may be connected. The openings 131 enable, for example, an operator to connect the signal transmission cables 105a to the connectors 109a and/or to open the connection. The cover 120 may include second openings 132 enabling access to the signal transmission cables 115a.

In the exemplary embodiment illustrated in FIG. 2, the side portions 120b, 120c extend only from the upper and lower portions of the overlapping portion 120a of the cover 120 and do not extend from left and right portions of the overlapping portion 120a of the cover 120. In embodiments of the invention, left and right portions of the space defined by the cover(s) 120 and the frame 107 may be covered by respective portions of the covers 140. In other embodiments of the invention, additional side portions may be formed on one or both of the left and right portions of the cover 120.

In the exemplary embodiment illustrated in FIG. 2, the covers 120 are provided on upper and lower portions of the frame 107 and the covers 140 are provided on left and right portions of the frame 107. The covers 140 may be similar in structure to the covers 120 described in detail above. Only differences between the covers 120 and the covers 140 will be described below. As shown in FIG. 2, when the covers 140 are arranged on the left and right sides of the frame 107, the covers 140 may overlap the signal transmission cables 105b and the buffer substrates 106b. Each of the covers 140 may include a side portion 145 that completely or substantially completely surrounds the four sides of an overlapping portion 145c of the cover 140. In embodiments of the invention, one or more slit(s) 145a may be formed on upper and/or lower portions of the side portion 145 of the cover 140. The slit(s) 145a may be provided, for example, to enable the cover 140 to be lowered onto and receive the wall/guiding portion 107c of the frame 107.

In embodiments of the invention, at least a portion 145d of the side portion 145 of the cover 140 contacts the rear surface 107a of the frame 107 to help reduce and/or prevent impurities from entering a space between the cover 140 and the frame 107. Another portion 145e of the side portion 145 of the cover 140 may extend from the overlapping portion 145c to the front surface of the frame 107 when the cover 140 is attached to the frame 107. In embodiments of the invention, at least the portion 145e of the side portion 145 may contact the front surface of the frame 107 to help reduce and/or prevent impurities from entering the space between the cover plate 140 and the frame 107. At least a portion of portion 145e of the side portion 145 of the cover 140 may overlap and/or contact a portion of the wall/guiding portion 107c of the frame 107.

The cover(s) 140 may include openings 151, 152 that allow components (e.g., signal transmission cables 105b)

arranged between the cover 140 and the frame 107 to be accessed without removing the cover 140. For example, the operator may connect the signal transmission cables 105b to the connectors 109b and/or release the connection via the opening(s) 151 formed on the cover 140. The openings 152 may enable access to the signal transmission cable(s) 115b that may extend from the buffer substrate 106b to the printed circuit board assembly 109.

In the plasma display panel illustrated in FIG. 2, the covers 120, 140 are arranged on four sides of the frame 107. More particularly, in the exemplary embodiment of the plasma display panel illustrated in FIG. 2, the exemplary covers 120, 140 are provided at edge portions of the frame 107. In other embodiments of the invention, however, one or more cover(s) employing one or more aspects of the invention may be arranged at other portions of a frame of a plasma display panel. In embodiments of the invention, a plurality of covers employing one or more aspects of the invention and having the same shape may be employed. In some embodiments of the invention, a cover employing one or more aspects of the invention may only be provided along one side or one portion of a frame or plasma display panel. For example, a cover employing one or more aspects of the invention may be omitted at upper, left and right portions of a frame, and a cover employing one or more aspects of the invention may only be provided at a lower portion of the frame because the impurities and/or damage may more often contaminate and/or occur around signal transmission cables that are disposed at the lower portion of the panel. Otherwise, the upper and lower cover only can be formed on the panel. In all cases, the side surface portion 120c or 145d contacting the rear surface 107a of the frame 107 should be formed in order to prevent the impurities from inducing into the cover.

Embodiments of the invention provide a cover for shielding and protecting signal transmission cable(s) of a plasma display device from impurities/contamination and/or damage. Therefore, the defect of the plasma display device generate due to the impurities can be prevented in advance. In addition, the impurities can be removed easily, and thus, the productivity of the device can be improved.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A plasma display device, comprising:
a plasma display panel including a first substrate and a second substrate;
a frame, the frame having a first side, a second side, and a guiding portion, the first substrate and the second substrate being arranged on the first side of the frame;
at least one printed circuit board arranged on the second side of the frame;
a plurality of signal transmission cables, at least some of the signal transmission cables having portions connected to electrodes formed on at least one of the first substrate and the second substrate, and extending along the guiding portion of the frame to the second side of the frame;
a plurality of buffer substrates, to which other portions of the signal transmission cables are connected, the plurality of buffer substrates being arranged a surface of the second side of the frame; and
at least one cover including a first portion and a second portion, the first portion extending over at least one of the buffer substrates such that the at least one buffer substrate is arranged between the first portion and the second side of the frame and the second portion extending from the first portion, a first part of the second portion at least one of extending toward and contacting the surface of the second side of the frame and a second part of the second portion at least one of extending toward and contacting a surface of the guiding portion of the frame.

2. The plasma display panel as claimed in claim 1, wherein the other end portions of the signal transmission cables are connected the buffer substrates via connectors.

3. The plasma display apparatus as claimed in claim 2, wherein the first portion includes at least one opening exposing at least one of the connectors connecting the other end portions of the signal transmission cables to the buffer substrates.

4. The plasma display apparatus as claimed in claim 1, wherein the first part of the second portion includes an opening for passing a signal transmission cable extending between one of the buffer substrates and the printed circuit board.

5. The plasma display apparatus as claimed in claim 4, wherein the opening continuously extends from a portion of the first portion to a portion of the first part of the second portion.

6. The plasma display apparatus as claimed in claim 1, wherein the first part of the second portion extends from a first edge of the first portion and the first part extends perpendicularly to the first portion.

7. The plasma display apparatus as claimed in claim 6, wherein the second part of the second portion extends from a second edge of the first portion and the second part extends perpendicularly to the first portion.

8. The plasma display apparatus as claimed in claim 1, wherein the second portion further includes a third part including a slit formed along an edge of the third part that connects to the surface of the second side of the frame.

9. The plasma display apparatus as claimed in claim 8, wherein the second portion includes a fourth part and the first part, the second part, the third part and the fourth part extend perpendicularly to the first portion.

10. A cover for reducing contamination in a plasma display apparatus including a plasma display panel, a frame with at least one printed circuit board, a plurality of signal transmission cables and a plurality of buffer substrates arranged on one side thereof, the frame including a guiding portion for guiding the signal transmission cables, the cover comprising:
a first portion and a second portion, the second portion including a first part and a second part, the first portion and the second portion forming a substantially "u"-shaped cavity,
wherein when the cover is detachably attached to the frame of the plasma display apparatus:
the first portion extends over the buffer substrates such that the buffer substrates are arranged between the first portion of the cover and the frame,
an end portion of the first part at least one of extends towards and contacts a surface of the frame on which the plurality of buffer substrates and the at least one printed circuit board are arranged, and an end portion of the second part at least one of extends towards contacts the guiding portion of the frame.

11. The cover as claimed in claim 10, wherein the first portion includes a plurality of openings.

12. The cover as claimed in claim 10, wherein the second portion further includes a third part including a slit along an end portion of the third part that contacts the surface of the frame when the cover is detachably attached to the frame.

13. The cover as claimed in claim 12, wherein the second portion includes a fourth part and the first part, the second part, the third part and the fourth part extend perpendicularly to the first portion.

14. The cover as claimed in claim 10, wherein the first part of the second portion extends from a first edge of the first portion and the first part extends perpendicularly to the first portion.

15. The cover as claimed in claim 10, wherein the second part of the second portion extends from a second edge of the first portion and the second part extends perpendicularly to the first portion.

16. A plasma display apparatus, comprising:
a plasma display panel including a first substrate and a second substrate;
a frame, the frame having a first side, a second side, and a guiding portion, the first substrate and the second substrate being arranged on the first side of the frame;
at least one printed circuit board arranged on the second side of the frame;
a plurality of signal transmission cables, at least some of the signal transmission cables having portions connected to electrodes formed on at least one of the first substrate and the second substrate, and extending along the guiding portion of the frame to the second side of the frame;
a plurality of buffer substrates, to which other portions of the signal transmission cables are connected, the plurality of buffer substrates being arranged a surface of the second side of the frame; and
contamination reducing means for reducing contamination of the signal transmission cables, the contamination reducing means at least partially overlapping three sides of the buffer substrates.

17. The plasma display apparatus as claimed in claim 16, wherein the contamination reducing means includes at least one opening that exposes at least one connector connecting the other end portions of the signal transmission cables to the buffer substrates.

18. The plasma display apparatus as claimed in claim 17, wherein the contamination reducing means includes at least one openings that allows at least one signal transmission cable extending between one of the buffer substrates and the at least one printed circuit board.

19. The plasma display apparatus as claimed in claim 16, wherein the contamination reducing means has a substantially u-like shape.

20. The plasma display apparatus as claimed in claim 16, wherein the contamination reducing means has a substantially box-like shape with one side that is substantially or completely open.

* * * * *